(12) United States Patent
Kim et al.

(10) Patent No.: US 12,137,535 B2
(45) Date of Patent: Nov. 5, 2024

(54) DYNAMIC EXHAUST FAN OPERATION TO IMPROVE USER EXPERIENCE

(71) Applicant: Microsoft Technology Licensing, LLC, Redmond, WA (US)

(72) Inventors: Donghwi Kim, Kirkland, WA (US); Gregory Allen Nielsen, Kirkland, WA (US); Benjamin Francis Walker, Vancouver (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 350 days.

(21) Appl. No.: 17/748,466

(22) Filed: May 19, 2022

(65) Prior Publication Data
US 2023/0380100 A1  Nov. 23, 2023

(51) Int. Cl.
*H05K 7/20* (2006.01)
*G06F 1/20* (2006.01)

(52) U.S. Cl.
CPC ......... *H05K 7/20209* (2013.01); *G06F 1/203* (2013.01); *G06F 1/206* (2013.01); *H05K 7/20154* (2013.01); *H05K 7/20336* (2013.01)

(58) Field of Classification Search
CPC ............ G06F 1/20; G06F 1/203; G06F 1/206; H05K 7/20154; H05K 7/20209; H05K 7/20336
See application file for complete search history.

(56) References Cited

U.S. PATENT DOCUMENTS

| | | | |
|---|---|---|---|
| 6,349,385 | B1 | 2/2002 | Kaminski et al. |
| 7,630,856 | B2 | 12/2009 | Rockenfeller et al. |
| 8,031,466 | B2 | 10/2011 | Katoh et al. |
| 9,207,732 | B1 | 12/2015 | Chen et al. |
| 9,239,598 | B2 * | 1/2016 | Degner ................... G06F 1/181 |

(Continued)

FOREIGN PATENT DOCUMENTS

| | | | | |
|---|---|---|---|---|
| CN | 1713157 | A | | 12/2005 |
| CN | 100407098 | C | * 7/2008 | ......... F28D 15/0233 |

(Continued)

OTHER PUBLICATIONS

IBM, Collapsible Mobile Exhaust System, Dec. 3, 2003, An IP.com Prior Art Database Technical Disclosure. (Year: 2003).*

(Continued)

*Primary Examiner* — Crystal J Barnes-Bullock
(74) *Attorney, Agent, or Firm* — Holzer Patel Drennan

(57) ABSTRACT

A thermal management system for a computing device often includes one or more internal heat pipes and conductive structures to move heat from one or more heat-generating components within the computing device to a heat exchanger. For an air-cooled device, one or more exhaust fans blow air across the heat exchanger to transfer heat from the heat exchanger to the air before it is exhausted out of the computing device. While operation of the exhaust fans may be necessary to maintain device temperature below one or more thresholds, exhaust fan operation may be optimized to maximize the user experience. The presently disclosed technology applies distinct exhaust fan speed and/or direction profiles for each of one or more exhaust fans within the computing device to maximize the user experience, particularly to reduce or avoid blowing hot air at the user's hand.

20 Claims, 5 Drawing Sheets

(56) References Cited

U.S. PATENT DOCUMENTS

| | | |
|---|---|---|
| 2013/0081779 A1 | 4/2013 | Liao |
| 2014/0043750 A1 | 2/2014 | Calderone et al. |
| 2015/0261268 A1 | 9/2015 | Gong et al. |
| 2016/0363971 A1* | 12/2016 | Delano ................ G06F 1/203 |
| 2017/0374760 A1 | 12/2017 | Chen |

FOREIGN PATENT DOCUMENTS

| | | | | |
|---|---|---|---|---|
| JP | 3805723 B2 * | 8/2006 | ......... | F28D 15/0275 |
| JP | 4193207 B2 * | 12/2008 | ............ | H05K 7/20 |
| JP | 4327320 B2 * | 9/2009 | ............ | G06F 1/203 |
| JP | 2009231747 A * | 10/2009 | ............ | G06F 1/20 |
| JP | 4738121 B2 | 5/2011 | | |
| JP | 2012018683 A * | 1/2012 | ............ | G06F 1/203 |

OTHER PUBLICATIONS

IBM, Exhaust Heat Redirection on Portable Electronic Devices, Nov. 15, 2005, An IP.com Prior Art Database Technical Disclosure. (Year: 2005).*

"SystemParametersInfoA function (Winuser.h)", Retrieved from: https://docs.microsoft.com/en-us/windows/win32/api/winuser/nf-winuser-systemparametersinfoa, Oct. 13, 2021, 43 Pages.

Singh, et al., "Power, Performance and Thermal Management Using Hardware Performance Counters", In Proceedings of IEEE International Conference on Electronics, Computing and Communication Technologies (CONECCT), Jul. 2, 2020, 7 Pages.

"International Search Report and Written Opinion Issued in PCT Application No. PCT/US2023/013397", Mailed Date: Jun. 6, 2023, 11 Pages.

* cited by examiner

DYNAMIC EXHAUST FAN OPERATION TO IMPROVE USER EXPERIENCE

BACKGROUND

Computing devices commonly generate large amounts of waste heat that is internally managed and ultimately exhausted pursuant to a thermal management system. A thermal management system for a computing device often includes one or more internal heat pipes and conductive structures to move heat from one or more heat-generating components within the computing device to a heat exchanger. For an air-cooled device, one or more exhaust fans blow air across the heat exchanger to transfer heat from the heat exchanger to the air before it is exhausted out of the computing device.

SUMMARY

Implementations described and claimed herein provide a computing device comprising one or more heat-generating components oriented in an interior of the computing device; a first exhaust fan also oriented in the interior of the computing device, the first exhaust fan having a first exhaust vent positioned on an exterior of the computing device; a second exhaust fan also oriented in the interior of the computing device, the second exhaust fan having a second exhaust vent positioned on the exterior of the computing device, the second exhaust vent position separated from the first exhaust vent position; a heat path from the heat-generating components to the first exhaust fan and the second exhaust fan; and a dynamic exhaust fan thermal management control. The dynamic exhaust fan thermal management control determines that a user-manipulable peripheral device is connected to the computing device, determines a location of the user-manipulable peripheral device with respect to the computing device, and biases against operation of one of the first and second exhaust fans having an exhaust vent position nearest the determined location of the peripheral device.

Implementations described and claimed herein further provide a cooling method for a computing device having a user-manipulable peripheral device. The cooling method includes determining that the user-manipulable peripheral device is connected to the computing device, determining a location of the user-manipulable peripheral device with respect to the computing device, and biasing against operation of one of the first and second exhaust fans having an exhaust vent position nearest the determined location of the peripheral device.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

Operation of one or more exhaust fans for a computing device is generally controlled by a thermal management system and can affect the user experience of the computing device. When a user is actively using the computing device, operation of the exhaust fans can cause undesirable noise and exhaust of hot air. While operation of the exhaust fans may be necessary to maintain device temperature below one or more thresholds, exhaust fan operation may be optimized to maximize the user experience, while still maintaining sufficient exhaust fan operation to meet device internal temperature and performance requirements. While exhaust fan speed is often optimized to minimize noise and power consumption when the device temperature is low (e.g., exhaust fans speeds low or off) and then ramped up to increase thermal transfer to exhaust air when the device temperature rises (e.g., exhaust fans speeds medium to high), no prior solution leverages applying distinct exhaust fan speed and/or direction profiles for each of one or more exhaust fans within the computing device to maximize the user experience, particularly to reduce or avoid blowing hot air at the user's hand.

Figure 1:
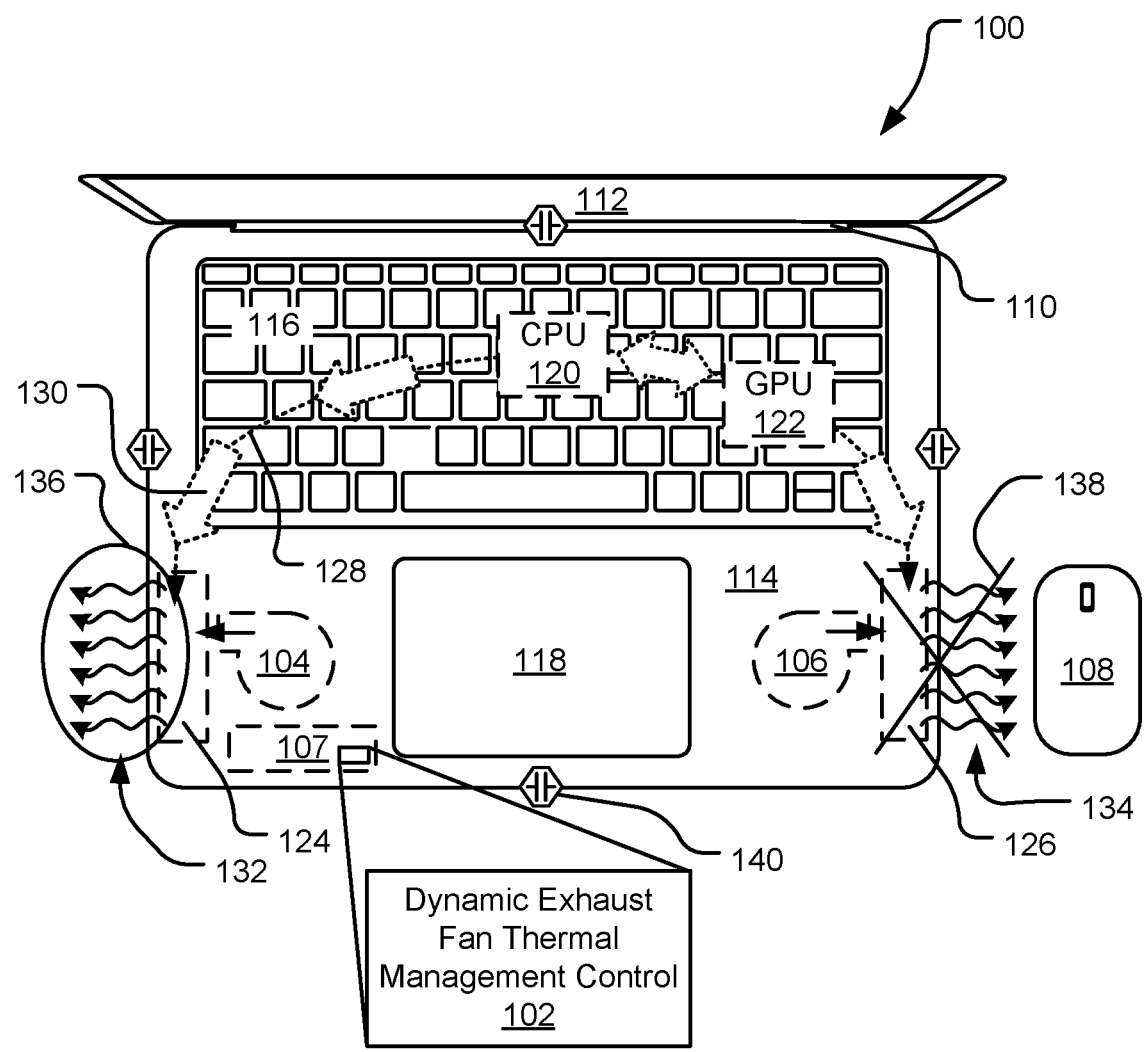
FIG. 1 illustrates a top perspective view of an example computing device including a dynamic exhaust fan thermal management control to improve user experience by biasing speed of dynamic exhaust fans away from a user-manipulable peripheral device.

FIG. 1 illustrates a top perspective view of an example computing device 100 including a dynamic exhaust fan thermal management control 102 to improve user experience by biasing speed of dynamic exhaust fans 104, 106 away from a user-manipulable peripheral input device 108. Hinge 110 pivotally connects a display component (or first hinged component) 112 with a keyboard component (or second hinged component) 114 of the device 100. As a result, a user (not shown) may position the display component 112 at a variety of angles with respect to the keyboard component 114 to achieve a desired viewing angle to the display component 112, or for other user considerations.

During normal operation of the computing device 100, the user is seated in front of the computing device 100. The computing device 100 includes user-manipulable integrated input devices (e.g., keyboard 116 and touchpad 118) and the user-manipulable peripheral input device 108 (e.g., a computer mouse) oriented to a side of the computing device 100 generally corresponding to the user's dominant hand. Here, the user's right hand is dominant and thus the mouse is oriented to the right side of the computing device 100. Still further, the display component 112 may be selectively separable from the keyboard component 114.

While the computing device 100 is illustrated as a laptop computer, the thermal management control 102 may be incorporated into any computing device (e.g., mobile phones, tablet computers, laptop computers, personal computers, gaming devices, smart phones) reliant at least in part on forced-air cooling and capable of receiving inputs from the user-manipulable peripheral device 108 and carrying out one or more sets of arithmetic and/or logical operations. Further, while the user-manipulable peripheral device 108 is illustrated as a computer mouse, the user-manipulable peripheral device 108 may be any device intended for user manipulation and to be used in conjunction with the computing device 100 (e.g., styluses, handheld controllers, keyboards, keypads, trackpads, trackballs, and mice). Still further, the thermal management control 102 may be applied to vehicles (e.g., automobiles, watercraft, and aircraft), consumer electronics (e.g., cameras, telephones, and home appliances), medical devices, and industrial or commercial machinery, any of which may adopt one or more computing devices as contemplated herein.

Several internal components of the computing device 100 are illustrated in broken lines indicating that such components are not normally visible from an exterior of the computing device 100. Internal heat-generating components (e.g., central processing unit (CPU) 120 and graphics processing unit (GPU) 122) generate substantial thermal energy within the computing device 100 that is managed by the thermal management control 102. Other heat-generating components within the computing device 100 may include batteries, printed circuit boards (PCBs), system-on-chips (SOCs), and data storage devices, for example.

The CPU 120 and the GPU 122 are thermally connected to heat exchangers 124, 126 via a series of thermally conductive structures and/or heat pipes (collectively, a heat path, illustrated by dotted line 128). Thick dotted arrows (e.g., arrow 130) illustrate the direction of heat transfer, generally running from the CPU 120 and the GPU 122 to the heat exchangers 124, 126. The heat exchangers 124, 126 constitute any mechanical arrangement effective at transferring thermal energy from the heat path to a forced-air cooling flow through the heat exchangers 124, 126. In other implementations, multiple heat paths are used to conduct heat from the internal heat-generating components to the heat exchangers 124, 126. Still further implementations may include fewer or greater than the two depicted heat exchangers 124, 126.

Internal exhaust fan 104 is associated with heat exchanger 124 and has a variable fan speed to vary cooling air flow volume from the exhaust fan 104, through the heat exchanger 124 (thereby adding thermal energy to the cooling air flow), and out of the computing device 100, as illustrated by wavy arrows 132. Similarly, internal exhaust fan 106 is associated with heat exchanger 126 and has a variable fan speed to vary cooling air flow volume from the exhaust fan 106, through the heat exchanger 126 (thereby adding thermal energy to the cooling air flow), and out of the computing device 100, as illustrated by wavy arrows 134. The internal exhaust fans 104, 106 are independently driven by the thermal management control 102 and have different speeds in a variety of operation conditions of the computing device 100. This is technically advantageous as it gives the dynamic exhaust fan thermal management control 102 the ability to bias operation of the internal exhaust fans 104, 106.

The exhaust fans 104, 106 each include exhaust vents that permit the cooling air flow to exit the computing device 100. The exhaust vents each have a position proximate their associated exhaust fans 104, 106, which can be described by their position on an exterior surface of the computing device 100. For example, the exhaust vent associated with the exhaust fan 104 is positioned on a front-left side of the computing device 100, while the exhaust vent associated with the exhaust fan 106 is positioned on a front-right side of the computing device 100. Other implementations may adopt different positions on the exterior of the computing device 100 for the exhaust vents. Other implementations may further have a greater or fewer number of exhaust fans and associated exhaust vents and heat exchangers.

The dynamic exhaust fan thermal management control 102 determines that the user-manipulable peripheral device 108 is connected to the computing device 100. This connection determination may be accomplished by querying the computing device 100 operating system for connected user-manipulable peripheral devices. The thermal management control 102 further determines a location of the user-manipulable peripheral device 108 with respect to the computing device 100. This location determination may also be accomplished by querying the computing device 100 operating system.

For example, the computing device 100 operating system may inform the thermal management control 102 that the connected user-manipulable peripheral device 108 is a computer mouse and that the current user is right-handed (e.g., as identified by the location (left or right) of the primary click button on a computer mouse). This information may be used by the thermal management control 102 to infer a location of the user-manipulable peripheral device 108 on a right-side of the computing device 100 based on a typical user arrangement of a computer mouse with reference to the computing device 100.

In other implementations, the computing device 100 incorporates sensors (e.g., sensor 140 on each side of the computing device 100 where the user-manipulable peripheral device 108 is expected to be operated. Here, sensor 140 is positioned on a front of the computing device 100. Other illustrated sensors are positioned on the left-side, right-side, and rear of the computing device 100. In various implementations, the sensors may operate by detecting object proximity or movement and may use optical, thermal, infrared, microwave, or ultrasonic technology, as examples, any of which may be capable of detecting the presence of the user-manipulable peripheral device 108 and/or the user's hand.

The sensors are used to determine a location of the user-manipulable peripheral device 108 with respect to the computing device 100 and communicate the determined location to the thermal management control 102. In an example use case, the sensor 104 is a user-facing camera (e.g., a webcam) for the computing device 100. The camera may be used to monitor the user's body position with reference to the computing device 100, including the user's extremities that are in view of the camera. The camera may also detect the user-manipulable peripheral device 108. Based on the user's body position and/or the user-manipulable peripheral device 108 that is in view of the camera, the thermal management control 102 may infer a location of the user-manipulable peripheral device 108 with respect to the computing device 100. Use of the sensors is technically advantageous in that any errors in user configuration setting in the operating system would not affect operation of the thermal management control 102.

In some implementations, the thermal management control 102 may further determine if the user-manipulable peripheral device 108 is currently in use and only perform the following biasing operation so long as the user-manipulable peripheral device 108 is in use. In various implementations, use may be detected by movement as detected by the illustrated sensors or movement inputs actively being received by the computing device 100. Limiting application of the following biasing operation to scenarios where the user-manipulable peripheral device 108 is in use allows for improved cooling performance for the computing device 100 when the user-manipulable peripheral device 108 is not in use, though it is connected and present.

The thermal management control 102 biases against operation of one of the exhaust fans 104, 106 having an exhaust vent position nearest the determined location of the user-manipulable peripheral device 108. For example, the thermal management control 102 has inferred a location of the user-manipulable peripheral device 108 on a right-side of the computing device 100. In response, the thermal management control 102 biases toward operation of the exhaust fan 104 (as illustrated by "O" 136) and away from operation of the exhaust fan 106 (as illustrated by "X" 138). In various implementations, biasing operation of the exhaust fans 104, 106 may mean operation of one fan to the exclusion of the other fan or operation of one of the exhaust fans 104, 106 at a higher rate of speed than the other fan, for example. Further, operation of the exhaust fans 104, 106 may be driven by ramping curves (not shown, see e.g., FIG. 2 and related description below).

In some implementations, the thermal management control 102 instructs the computing device 100 operating system to inform the user that the thermal management control 102 is biasing against operation of one of the exhaust fans 104, 106 based on the determined location of the user-manipulable peripheral device 108. This may take the form of a visual notification appearing on the display component 112. The user may also be given the option to the override the bias against operation of one of the exhaust fans 104, 106. This option may be chosen when the user no longer intends to use the user-manipulable peripheral device 108 or the location of the user-manipulable peripheral device 108 was incorrectly determined by the thermal management control 102, for example. In still further implementations, the user may also be given the option to manually bias against operation of one of the exhaust fans 104, 106.

The thermal management control 102 is illustrated as firmware implemented on an exhaust fan microcontroller 107. In other implementations, the thermal management control 102 is be implemented as firmware or software running on other dedicated hardware (e.g., a fan throttling system on a chip (SOC)) or hardware shared with other components of the computing device 100 (e.g., a central processing unit (CPU)). Further, when implemented as software, the thermal management control 102 may occupy storage space in memory shared with other features of the computing device 100 (e.g., an operating system) or memory that is separate and specifically associated with the exhaust fan microcontroller 107. While illustrated with particularity, the various components of the computing device 100 discussed herein may have variety of shapes and sizes and be located in a variety of spaces within the computing device 100.

Figure 2:
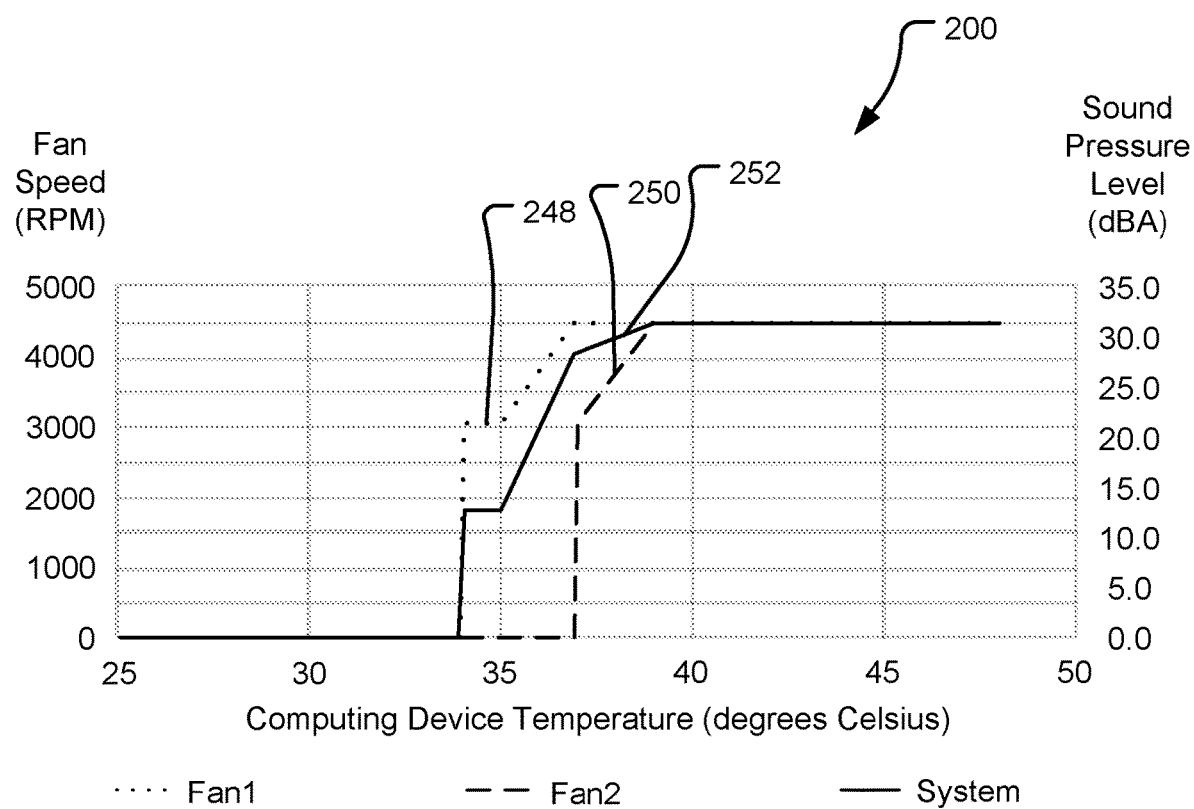
FIG. 2 illustrates an example dynamic exhaust fan thermal management profile for each of two exhaust fans within a computing device.

FIG. 2 illustrates an example dynamic exhaust fan thermal management profile 200 for each of two exhaust fans within a computing device. Conventionally, multiple exhaust fans within a computing device are linked together such that the thermal management profile 200 is identical for both fans. As a result, a conventional thermal management controller varies the speed of the fans in unison and in response to changing thermal conditions within the computing device.

In the presently disclosed technology, the exhaust fans are separately driven by a dynamic thermal management controller, still in response to changing thermal conditions with the computing device, but also by biasing against operation of one of the exhaust fans having an exhaust vent position nearest a determined location of the user-manipulable peripheral device. This maximizes the user experience by reducing or avoid blowing hot air at the user's hand that is presumed to be proximate the user-manipulable peripheral device, but still minimizing overall fan operation to minimize fan power consumption and/or noise generation by the fans.

The fan thermal management profile 200 defines that the computing device includes two exhaust fans, each of which is capable of variable operation between 0 and approximately 4500 revolutions per minute (RPM). In other implementations, there may be fewer or greater than two exhaust fans, any or all of which may have fan speed operating windows different than that shown. Further, in some implementations, one or more of the exhaust fans may be capable of reverse speed operation, thereby converting the exhaust fan into an intake fan (see e.g., FIG. 3 and related description below).

Thermal conditions with the computing device are monitored by one or more temperature sensors. The temperature sensors are located in areas where the computing device temperature is expected to be at a maximum (i.e., at computing device hot spots), for example, at one or both of the palm rests for a laptop-type computing device. Under particularly low or high temperature conditions, the fans are operated identically. For example, both Fan1 (dotted line fan curve 248) and Fan2 (dashed line fan curve 250) are operated at 0 RPM (or operated in a fully off state) for computing device temperature conditions below approximately 33 degrees Celsius. In the fully off state, the fans generate substantially 0 decibels (dBA). Similarly, both Fan1 and Fan2 are operated at approximately 4500 RPM (or operated in a fully on state) for computing device temperature conditions above approximately 39 degrees Celsius. In the fully on state, the fans generate substantially 31 decibels (dBA). Other implementations may adopt different lower and upper temperature limits for fully off and fully on fan operation that that shown in FIG. 2 and described above.

However, in temperature conditions that are between the lower and upper temperature limits (e.g., 33-39 degrees Celsius), Fan1 and Fan2 are operated independently to both manage the thermal conditions with the computing device and bias against operation of one of the exhaust fans nearest the determined location of the user-manipulable peripheral device. Here, Fan2 is nearest the determined location of the user-manipulable peripheral device. Therefore, Fan1 begins operation when the computing device reaches approximately 33 degrees Celsius, while Fan2 does not begin operation until the computing device reaches approximately 37 degrees Celsius.

Each of the fan curves 248, 250 include a steep initial ramping up period, a consistent operation period exclusively for Fan1, and a sloping period to fully on states for each of Fan1 and Fan2. A system fan curve (solid line fan curve 252) is a composite of the fan curves 248, 250 for overall fan operation within the computing device. The provided fan curves 248, 250, 252 are examples only as fan curves for each of Fan1 and Fan2 and the overall system fan curve may vary substantially from that shown in FIG. 2. In various implementations, series of fan curves are available for the thermal management control to select from based on factors such as user-manipulable peripheral device presence, user-manipulable peripheral device position with reference to the computing device, and user power configuration setting (e.g., a power saving mode vs. a maximum performance mode).

Figure 3:
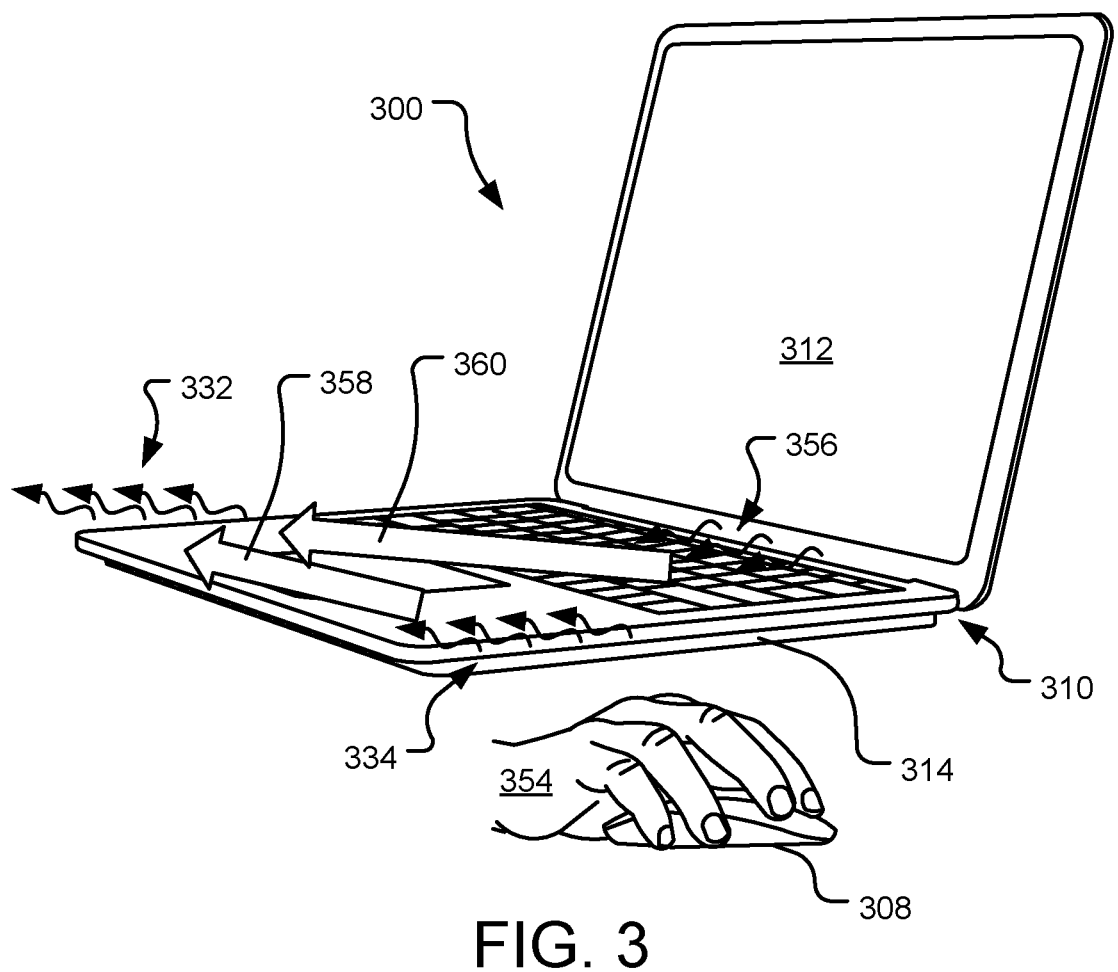
FIG. 3 illustrates a side perspective view of another example computing device including a dynamic exhaust fan thermal management control to improve user experience by biasing directionality of dynamic exhaust fans away from a user-manipulable peripheral device.

FIG. 3 illustrates a side perspective view of another example computing device 300 including a dynamic exhaust fan thermal management control to improve user experience by biasing directionality of dynamic exhaust fans away from a user-manipulable peripheral device 308. Hinge 310 pivotally connects a display component (or first hinged component) 312 with a keyboard component (or second hinged component) 314 of the device 300. As a result, a user (not shown) may position the display component 312 at a variety of angles with respect to the keyboard component 314 to achieve a desired viewing angle to the display component 312, or for other user considerations.

During normal operation of the computing device 300, the user is seated in front of the computing device 300. The computing device 300 includes user-manipulable integrated input devices (e.g., a keyboard and a touchpad) and the user-manipulable peripheral input device 308 (e.g., a computer mouse) oriented to a side of the computing device 300 generally corresponding to the user's dominant hand 354. Here, the user's right hand is dominant and thus the mouse is oriented to the right side of the computing device 300.

Internal heat-generating components generate substantial thermal energy within the computing device 300 that is managed by the thermal management control. The internal heat-generating components are thermally connected to heat exchangers via a series of thermally conductive structures and/or heat pipes (collectively, a heat path). One or more internal exhaust fans are associated with heat exchangers and have a variable fan speed and/or direction to vary cooling air flow volume from the exhaust fan(s), through the heat exchanger(s) (thereby adding thermal energy to the cooling air flow), and out of the computing device 300, as illustrated by wavy arrows 332 located on a left side of the computing device 300.

In some implementations, one or more of the exhaust fans is capable of reverse operation (also referred to herein as bi-directional fans), which effectively turns the exhaust fan into an intake fan for the computing device 300. This actively adds a cooling air flow to the computing device 300, as illustrated by wavy arrows 334 located on a right side of the computing device 300. In some implementations, the exhaust fans may not be as acoustically or operationally efficient in reverse operation. In these cases, reverse operation may only be available when the computing device temperature is relatively low. Further, a run-time switch may be included to limit fan operation in reverse.

The computing device 300 may also be equipped with one or more passive intake vents (e.g., vents at hinge 310 or other openings in the computing device 300) that permit cooling air flow to enter the computing device 300 by virtue of a negative pressure applied by one or more of the exhaust fans, as illustrated by wavy arrows 356 located on a rear side of the computing device 300. Further still, the passive intake vents may function as passive exhaust vents when one or more of the exhaust fans is operated in reverse and a positive pressure condition is created within the computing device 300. The internal exhaust fans are independently driven by the thermal management control and have different speeds and/or directions in a variety of operation conditions of the computing device 300.

While the exhaust vents are generally placed proximate the exhaust fans and associated heat exchangers, the intake vent(s) may be placed in a variety of locations on an exterior of the computing device 300. In some implementations, it is technically advantageous to place the intake vents in a surface of the computing device 300 away from the exhaust fans so as to drive air flow through the computing device 300 and achieve a level of air-cooling internal components of the computing device 300. In other implementations, the intake vents are placed in a manner to be concealed from the user, as is the case when the intake vent(s) are placed at the hinge 310, as illustrated in FIG. 3.

In some implementations, the exhaust fans each include an exhaust vent that permit the cooling air flow to enter or exit the computing device 300 and the exhaust fans are independently controlled as described herein. In other implementations, a singular exhaust fan is plumbed to multiple exhaust vents to save on part counts within the computing device 300. In such a case, the exhaust vents may be independently and selectively throttled from open to closed, including various states therebetween, with an exhaust vent damper to achieve a similar effect as throttling separate fans.

The dynamic exhaust fan thermal management control determines that the user-manipulable peripheral device 308 is connected to the computing device 300. The thermal management control further determines a location of the user-manipulable peripheral device 308 with respect to the computing device 300, here the right-side of the computing device 300. The thermal management control biases against operation of an exhaust fan having an exhaust vent position nearest the determined location of the user-manipulable peripheral device 108, here the exhaust fan having an exhaust vent position at the right-side of the computing device 300.

For example, the thermal management control has determined a location of the user-manipulable peripheral device 308 on a right-side of the computing device 300. In response, the thermal management control biases cooling air directionality from a rear and right-side of the computing device 300 to a left-side of the computing device, as illustrated by large arrows 358, 360. Large arrow 358 indicates an exhaust fan at the left-side of the computing device 300 operated in an on state and an exhaust fan at the right-side of the computing device 300 operated in an off state or a reverse state, as an example. Large arrow 360 indicates an exhaust fan at the left-side of the computing device 300 operated in an on state and a passive vent at the rear of the computing device 300 permitting cooling air to enter the computing device 300, as an example.

In another example, the computing device 300 includes a singular exhaust fan capable of bidirectional operation and connect to both vents on the left-side and the right-side of the computing device 300. The directionality of the singular exhaust fan is determined by the location of the user-manipulable peripheral device 308 in that the exhaust direction is chosen so that it is directed away from the user's hand 354.

In various implementations, biasing operation of the exhaust fans may mean operation of one fan to the exclusion of the other fan, operation of one of the exhaust fans at a higher rate of speed than the other fan, and/or operation of the exhaust fans in opposite directions, for example. Further, operation of the exhaust fans may be driven by ramping curves (not shown, see e.g., FIG. 2 and related description above).

Figure 4:
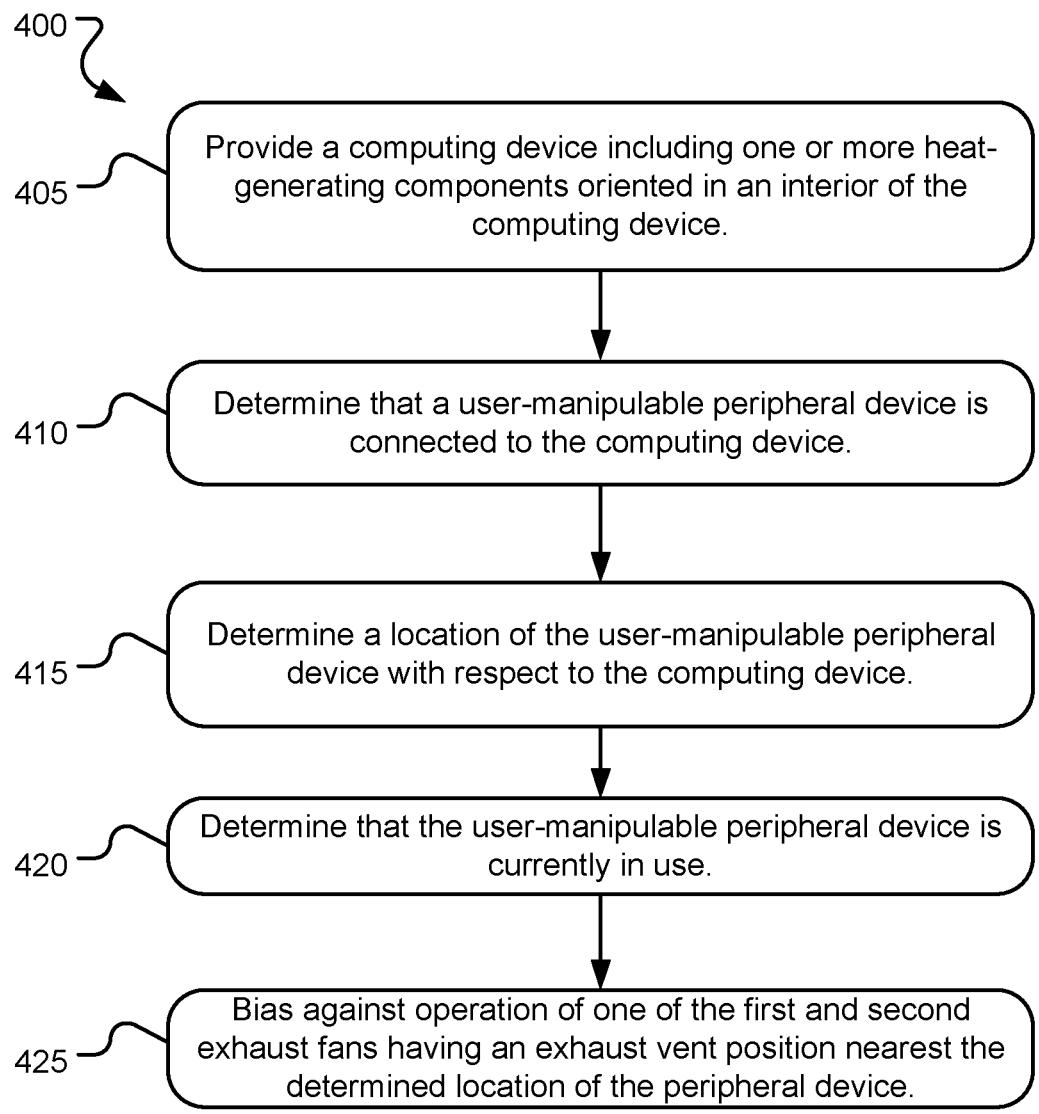
FIG. 4 illustrates example operations for cooling a computing device having a user-manipulable peripheral device.

FIG. 4 illustrates example operations 400 for cooling a computing device having a user-manipulable peripheral device. A providing operation 405 provides the computing device including one or more heat-generating components oriented in an interior of the computing device. The computing device further includes a first exhaust fan also oriented in the interior of the computing device, the first exhaust fan having a first exhaust vent positioned on an exterior of the computing device. The computing device further still includes a second exhaust fan also oriented in the interior of the computing device, the second exhaust fan having a second exhaust vent positioned on the exterior of the computing device, the second exhaust vent position separated from the first exhaust vent position. The computing device still further includes a heat path from the heat-generating components to the first exhaust fan and the second exhaust fan.

A first determining operation 410 determines that the user-manipulable peripheral device is connected to the computing device. In various implementations, the first determining operation 410 is performed by querying the computing device operating system to determine if the user-manipulable peripheral device is connected or by detecting the presence of the user-manipulable peripheral device using one or more sensors embedded within the computing device.

A second determining operation 415 determines a location of the user-manipulable peripheral device with respect to the computing device. In various implementations, the first determining operation 410 is performed by querying the computing device operating system to determine the type of user-manipulable peripheral device and user dominant hand to presume the location of the user-manipulable peripheral device with respect to the computing device. In other implementations, the second determining operation 415 is performed using the one or more sensors embedded within the computing device.

A third determining operation 420 determines that the user-manipulable peripheral device is currently in use. In various implementations, the third determining operation 420 is performed by monitoring the computing device operating system for active inputs received from the user-manipulable peripheral device or by detecting motion of the user-manipulable peripheral device using one or more sensors embedded within the computing device.

A biasing against operation 425 biases against operation of one of the first and second exhaust fans having an exhaust vent position nearest the determined location of the peripheral device. In some implementations, the biasing against operation 425 includes running one of the first and second exhaust fans at a lower speed than the other of the first and second exhaust fans, which may minimize the cooling performance impact of the biasing against operation 425. In other implementations, the biasing against operation 425 includes running only one of the first and second exhaust fans, which may minimize noise by running only one exhaust fan. In still further implementations where the first and second exhaust fans are bi-directional, the biasing against operation 425 includes running one of the first and second exhaust fans in a positive air flow direction and the other of the first and second exhaust fans in a negative air flow direction. To the extent the fans are bi-directional, reversing one of the exhaust fans achieves the biasing against operation 425 without a substantial cooling performance penalty as both fans are still actively used to cool the computing device.

The operations making up the embodiments of the invention described herein are referred to variously as operations, steps, objects, or modules. The operations may be performed in any order, adding or omitting operations as desired, unless explicitly claimed otherwise or a specific order is inherently necessitated by the claim language.

Figure 5:
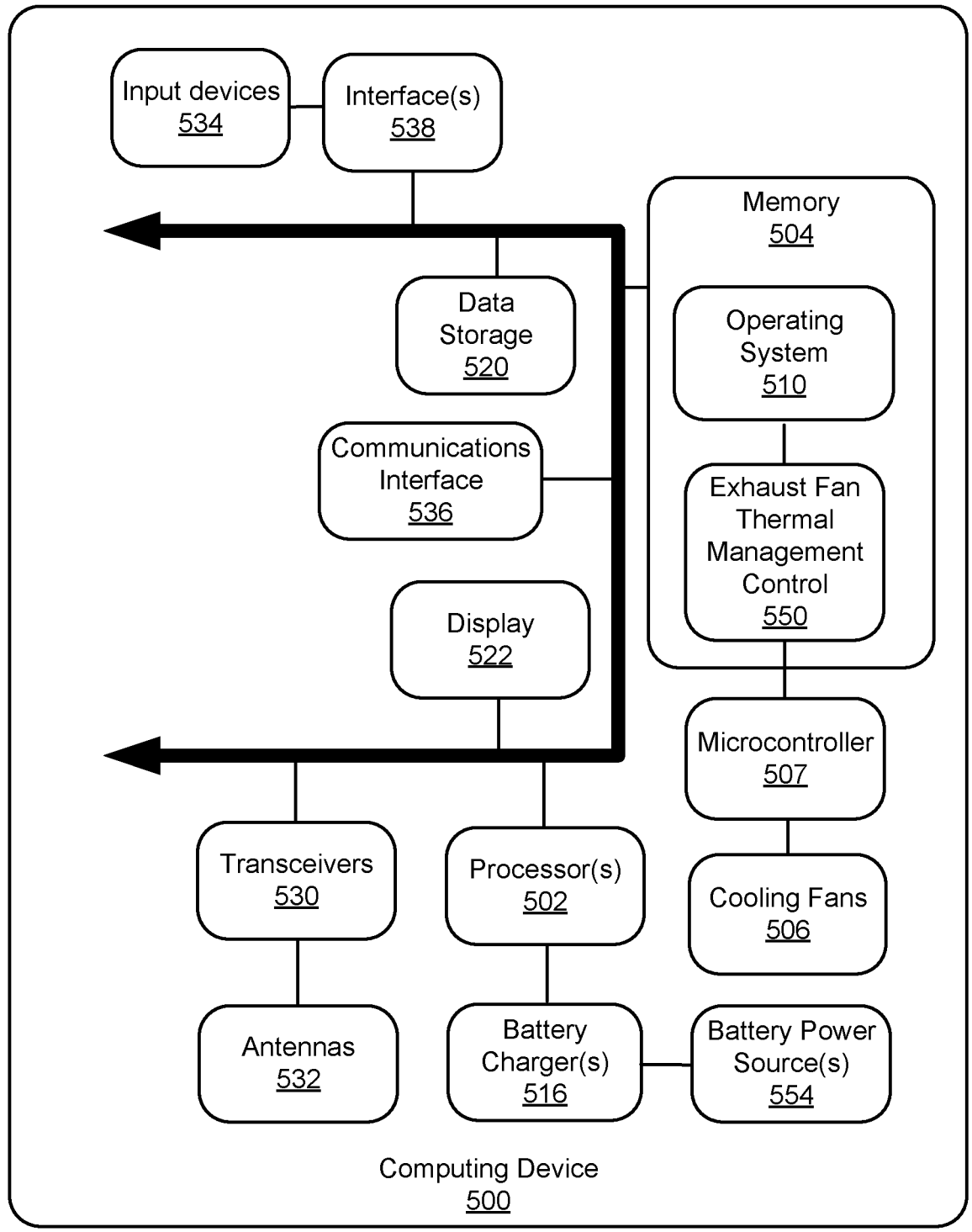
FIG. 5 illustrates an example computing device for use in executing dynamic exhaust fan thermal management control logic.

FIG. 5 illustrates an example computing device 500 for use in executing dynamic exhaust fan thermal management control logic 550. The computing device 500 may be a client device, such as a laptop, mobile device, desktop, tablet, or a server/cloud device. The computing device 500 may include one or more external input devices (or user-manipulable peripheral devices) 534 such that a user may enter commands and information (e.g., a keyboard or mouse). These and other input devices may be coupled to the computing device 500 by one or more interfaces 538 such as a serial port interface, parallel port, or universal serial bus (USB). The computing device 500 may further include a display 522, such as a touch screen display.

The computing device 500 further includes one or more processor(s) 502 and a memory 504. The memory 504 generally includes both volatile memory (e.g., RAM) and non-volatile memory (e.g., flash memory). An operating system 510 resides in the memory 504 and is executed by the processor(s) 502. One or more modules or segments, such as the dynamic exhaust fan thermal management control logic 550, application modules, and other modules, are loaded into the operating system 510 on the memory 504 and/or data storage 520 and executed by processor(s) 502. In various implementations, the fastener retention detection logic 550 drives operation of one or more cooling fans 506 via microcontroller 507.

Specifically, the thermal management control logic 550 power management configuration settings, such as external input device 534 presence, external input device 534 position with reference to the computing device 500, and user power configuration setting (e.g., a power saving mode vs. a maximum performance mode). The power management configuration settings are then used to select appropriate fan curves for operation of the cooling fans 506. The thermal management control logic 550 further receives computing device 500 chassis temperature information to define the location on the fan curves where the computing device 500 is currently operating.

The power management configuration settings and the chassis temperature information are used by the thermal management control logic 550 to set fan parameters (e.g., fan speed and direction for each of the cooling fans 506) and communicate the fan parameters to the microcontroller 507. The microcontroller 507 adjusts an input signal to the cooling fans 506 to achieve the fan speeds and directions defined by the thermal management control logic 550.

The computing device 500 also includes battery power source(s) 554 and associated battery charger(s) 516 to provide power to components of the computing device 500, particularly heat-generating components such as processor(s) 502 (e.g., CPUs and GPUs). The battery charger(s) 516 may also be connected to an external power source that overrides or recharges battery cells within the battery power source(s) 554.

The computing device 500 may include one or more communication transceivers 530 which may be connected to one or more antenna(s) 532 to provide network connectivity (e.g., mobile phone network, Wi-Fi®, Bluetooth®) to one or more other servers and/or client devices (e.g., mobile devices, desktop computers, or laptop computers). The computing device 500 may further include a communications interface 536, which may be used for establishing connections over a wide-area network (WAN) or local-area network (LAN). The network connections shown are exemplary and that other communications devices for establishing a communications link between the computing device 500 and other devices may be used.

The computing device 500 may include a variety of tangible processor-readable storage media and intangible processor-readable communication signals. Tangible processor-readable storage can be embodied by any available media that can be accessed by the computing device 500 and includes both volatile and nonvolatile storage media, removable and non-removable storage media. Tangible processor-readable storage media excludes intangible communications signals and includes volatile and nonvolatile, removable and non-removable storage media implemented in any method or technology for storage of information such as processor-readable instructions, data structures, program modules or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the computing device 500.

In contrast to tangible processor-readable storage media, intangible processor-readable communication signals may embody processor-readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, radio-frequency (RF), infrared, and other wireless media.

Implementations disclosed herein include a computing device comprising: one or more heat-generating components oriented in an interior of the computing device; a first exhaust fan also oriented in the interior of the computing device, the first exhaust fan having a first exhaust vent positioned on an exterior of the computing device; a second exhaust fan also oriented in the interior of the computing device, the second exhaust fan having a second exhaust vent positioned on the exterior of the computing device, the second exhaust vent position separated from the first exhaust vent position; a heat path from the heat-generating components to the first exhaust fan and the second exhaust fan; and a dynamic exhaust fan thermal management control. The dynamic exhaust fan thermal management control determines that a user-manipulable peripheral device is connected to the computing device; determines a location of the user-manipulable peripheral device with respect to the computing device; and biases against operation of one of the first and second exhaust fans having an exhaust vent position nearest the determined location of the user-manipulable peripheral device.

In further implementations disclosed herein, the dynamic exhaust fan thermal management control is further to: prior to the bias against operation, determine that the user-manipulable peripheral device is currently in use.

In further implementations disclosed herein, the bias against operation of one of the first and second exhaust fans includes running one of the first and second exhaust fans at a lower speed than the other of the first and second exhaust fans.

In further implementations disclosed herein, the bias against operation of one of the first and second exhaust fans includes running only one of the first and second exhaust fans.

In further implementations disclosed herein, the first and second exhaust fans are bi-directional, the bias against operation of one of the first and second exhaust fans includes running one of the first and second exhaust fans in a positive air flow direction and the other of the first and second exhaust fans in a negative air flow direction.

In further implementations disclosed herein, the user-manipulable peripheral device is one of a mouse, a trackpad, a trackball, a keyboard, a keypad, a handheld controller, and a stylus.

In further implementations disclosed herein, the heat-generating components include one or more central processing units and graphics processing units for the computing device.

Implementations disclosed herein further comprise: multiple heat-generating components oriented in the interior of the computing device; and multiple heat paths leading from the heat-generating components to the first exhaust fan and the second exhaust fan.

Implementations disclosed herein further comprise: a first heat exchanger connected to the heat path and oriented in an exhaust air flow of the first exhaust fan; and a second heat exchanger connected to the heat path and oriented in an exhaust air flow of the second exhaust fan.

In further implementations disclosed herein, the heat path includes one or more heat pipes connecting the heat-generating components to the first heat exchanger and the second heat exchanger.

Implementations disclosed herein further comprise: an air intake vent positioned on the exterior of the computing device, the air intake vent separated from the first exhaust vent position and the second exhaust vent position.

Implementations disclosed herein further comprise: a sensor to detect the location of the user-manipulable peripheral device with respect to the computing device and communicate the detected location to the dynamic exhaust fan thermal management control.

Implementations disclosed herein further include a cooling method for a computing device having a user-manipulable peripheral device comprising: providing the computing device including: one or more heat-generating components oriented in an interior of the computing device; a first exhaust fan also oriented in the interior of the computing device, the first exhaust fan having a first exhaust vent positioned on an exterior of the computing device; a second exhaust fan also oriented in the interior of the computing device, the second exhaust fan having a second exhaust vent positioned on the exterior of the computing device, the second exhaust vent position separated from the first exhaust vent position; and a heat path from the heat-generating components to the first exhaust fan and the second exhaust fan. The cooling method further comprises determining that the user-manipulable peripheral device is connected to the computing device; determining a location of the user-manipulable peripheral device with respect to the computing device; and biasing against operation of one of the first and second exhaust fans having an exhaust vent position nearest the determined location of the user-manipulable peripheral device.

Implementations disclosed herein further comprise: prior to the biasing against operation, determining that the user-manipulable peripheral device is currently in use.

In further implementations disclosed herein, the biasing against operation of one of the first and second exhaust fans includes running one of the first and second exhaust fans at a lower speed than the other of the first and second exhaust fans.

In further implementations disclosed herein, the first and second exhaust fans are bi-directional, and wherein the biasing against operation of one of the first and second exhaust fans includes running one of the first and second exhaust fans in a positive air flow direction and the other of the first and second exhaust fans in a negative air flow direction.

Implementations disclosed herein further include a computing device comprising: one or more heat-generating components oriented in an interior of the computing device; an exhaust fan also oriented in the interior of the computing device, the exhaust fan having one or more exhaust vents positioned on an exterior of the computing device; a heat path from the heat-generating components to the exhaust fan; and a dynamic exhaust fan thermal management control. The dynamic exhaust fan thermal management control is to: determine that a user-manipulable peripheral device is connected to the computing device; determine a location of the user-manipulable peripheral device with respect to the computing device; and bias operation of the exhaust fan to direct exhaust air flow away from the determined location of the user-manipulable peripheral device.

In further implementations disclosed herein, the exhaust fan is bi-directional, the bias operation of the exhaust fan includes running the exhaust fan in one of a positive air flow direction and a negative air flow direction.

Implementations disclosed herein further comprise: a first exhaust vent positioned on an exterior of the computing device; and a second exhaust vent positioned on the exterior of the computing device, the second exhaust vent position separated from the first exhaust vent position, the first and second exhaust vents both connected to the exhaust fan.

Implementations disclosed herein further comprise: an exhaust vent damper, wherein the bias operation of the exhaust fan includes adjusting a position of the exhaust vent damper to direct exhaust air flow away from one of the first and second exhaust vents nearest the determined location of the peripheral device.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A computing device comprising:
   one or more heat-generating components oriented in an interior of the computing device;
   a first exhaust fan also oriented in the interior of the computing device, the first exhaust fan having a first exhaust vent positioned on an exterior of the computing device;
   a second exhaust fan also oriented in the interior of the computing device, the second exhaust fan having a second exhaust vent positioned on the exterior of the computing device, the second exhaust vent position separated from the first exhaust vent position;
   a heat path from the heat-generating components to the first exhaust fan and the second exhaust fan; and
   a dynamic exhaust fan thermal management control to:
      determine that a user-manipulable peripheral device is connected to the computing device;
      determine a location of the user-manipulable peripheral device with respect to the computing device; and
      bias against operation of one of the first and second exhaust fans having an exhaust vent position nearest the determined location of the user-manipulable peripheral device.

2. The computing device of claim 1, wherein the dynamic exhaust fan thermal management control is further to:
   prior to the bias against operation, determine that the user-manipulable peripheral device is currently in use.

3. The computing device of claim 1, wherein the bias against operation of one of the first and second exhaust fans includes running one of the first and second exhaust fans at a lower speed than the other of the first and second exhaust fans.

4. The computing device of claim 1, wherein the bias against operation of one of the first and second exhaust fans includes running only one of the first and second exhaust fans.

5. The computing device of claim 1, wherein the first and second exhaust fans are bi-directional, the bias against operation of one of the first and second exhaust fans includes running one of the first and second exhaust fans in a positive air flow direction and the other of the first and second exhaust fans in a negative air flow direction.

6. The computing device of claim 1, wherein the user-manipulable peripheral device is one of a mouse, a trackpad, a trackball, a keyboard, a keypad, a handheld controller, and a stylus.

7. The computing device of claim 1, wherein the heat-generating components include one or more central processing units and graphics processing units for the computing device.

8. The computing device of claim 1, further comprising:
   multiple heat-generating components oriented in the interior of the computing device; and
   multiple heat paths leading from the heat-generating components to the first exhaust fan and the second exhaust fan.

9. The computing device of claim 1, further comprising:
   a first heat exchanger connected to the heat path and oriented in an exhaust air flow of the first exhaust fan; and
   a second heat exchanger connected to the heat path and oriented in an exhaust air flow of the second exhaust fan.

10. The computing device of claim 9, wherein the heat path includes one or more heat pipes connecting the heat-generating components to the first heat exchanger and the second heat exchanger.

11. The computing device of claim 1, further comprising:
    an air intake vent positioned on the exterior of the computing device, the air intake vent separated from the first exhaust vent position and the second exhaust vent position.

12. The computing device of claim 1, further comprising:
    a sensor to detect the location of the user-manipulable peripheral device with respect to the computing device and communicate the detected location to the dynamic exhaust fan thermal management control.

13. A cooling method for a computing device having a user-manipulable peripheral device comprising:
    providing the computing device including:
       one or more heat-generating components oriented in an interior of the computing device;
       a first exhaust fan also oriented in the interior of the computing device, the first exhaust fan having a first exhaust vent positioned on an exterior of the computing device;
       a second exhaust fan also oriented in the interior of the computing device, the second exhaust fan having a second exhaust vent positioned on the exterior of the computing device, the second exhaust vent position separated from the first exhaust vent position; and a heat path from the heat-generating components to the first exhaust fan and the second exhaust fan;

determining that the user-manipulable peripheral device is connected to the computing device;

determining a location of the user-manipulable peripheral device with respect to the computing device; and biasing against operation of one of the first and second exhaust fans having an exhaust vent position nearest the determined location of the user-manipulable peripheral device.

14. The cooling method of claim 13, further comprising: prior to the biasing against operation, determining that the user-manipulable peripheral device is currently in use.

15. The cooling method of claim 13, wherein the biasing against operation of one of the first and second exhaust fans includes running one of the first and second exhaust fans at a lower speed than the other of the first and second exhaust fans.

16. The cooling method of claim 13, wherein the first and second exhaust fans are bi-directional, and wherein the biasing against operation of one of the first and second exhaust fans includes running one of the first and second exhaust fans in a positive air flow direction and the other of the first and second exhaust fans in a negative air flow direction.

17. A computing device comprising:
one or more heat-generating components oriented in an interior of the computing device;
an exhaust fan also oriented in the interior of the computing device, the exhaust fan having one or more exhaust vents positioned on an exterior of the computing device;
a heat path from the heat-generating components to the exhaust fan; and
a dynamic exhaust fan thermal management control to:
determine that a user-manipulable peripheral device is connected to the computing device;
determine a location of the user-manipulable peripheral device with respect to the computing device; and
bias operation of the exhaust fan to direct exhaust air flow away from the determined location of the user-manipulable peripheral device.

18. The computing device of claim 17, wherein the exhaust fan is bi-directional, the bias operation of the exhaust fan includes running the exhaust fan in one of a positive air flow direction and a negative air flow direction.

19. The computing device of claim 17, further comprising:
a first exhaust vent positioned on an exterior of the computing device; and
a second exhaust vent positioned on the exterior of the computing device, the second exhaust vent position separated from the first exhaust vent position, the first and second exhaust vents both connected to the exhaust fan.

20. The computing device of claim 19, further comprising:
an exhaust vent damper, wherein the bias operation of the exhaust fan includes adjusting a position of the exhaust vent damper to direct exhaust air flow away from one of the first and second exhaust vents nearest the determined location of the peripheral device.

* * * * *